United States Patent
Verkuil

[11] Patent Number: 6,072,320
[45] Date of Patent: Jun. 6, 2000

[54] PRODUCT WAFER JUNCTION LEAKAGE MEASUREMENT USING LIGHT AND EDDY CURRENT

[76] Inventor: Roger L. Verkuil, 37 Sherwood Hts., Wappinger Falls, N.Y. 12590

[21] Appl. No.: 08/902,869

[22] Filed: Jul. 30, 1997

[51] Int. Cl.[7] .................................................. G01R 31/302
[52] U.S. Cl. .............................................................. 324/750
[58] Field of Search ..................................... 324/751, 752, 324/767, 222, 226, 227

[56] References Cited

U.S. PATENT DOCUMENTS

| | | | |
|---|---|---|---|
| Re. 29,918 | 2/1979 | Verkuil ..................................... | 324/222 |
| 4,812,756 | 3/1989 | Curtis et al. ........................... | 250/492.2 |
| 4,980,639 | 12/1990 | Yoshizawa et al. ..................... | 324/751 |

OTHER PUBLICATIONS

"A Contactless Method for High–Sensitivity Meaurement of p–n Junction Leakage," IBM J. Res. Develop., vol. 24, No. 3, May 1980.

"A Novel Contactless Method fro Measuring Collector–Isolation P–N Junction Capacitance in LSI Wafers," Electrochemical Society Paper, R.L. Verkuil, 1981, (6 pgs), (unavailable month).

Primary Examiner—Josie Ballato
Assistant Examiner—Minh Tang
Attorney, Agent, or Firm—Pearne, Gordon, McCoy & Granger LLP

[57] ABSTRACT

A method for measuring junction leakage in a semiconductor product wafer while applying varying light to the wafer. A surface photovoltage characteristic for the wafer and an eddy current characteristic for the wafer in response to the light are measured. A junction leakage characteristic for at least one of junction types is determined by simultaneously measuring the surface photovoltage and the induced eddy current characteristics in response to a light flash.

4 Claims, 4 Drawing Sheets

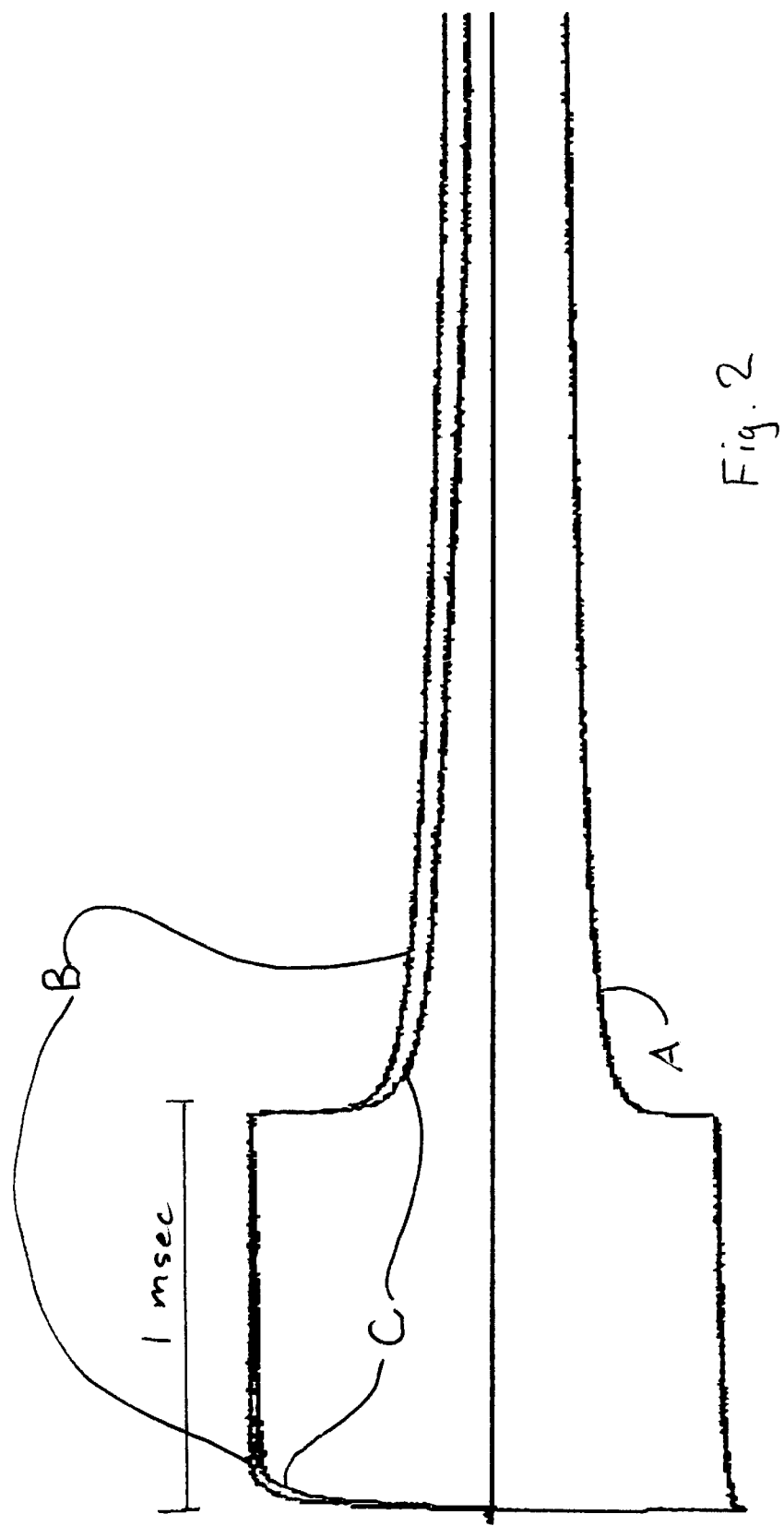

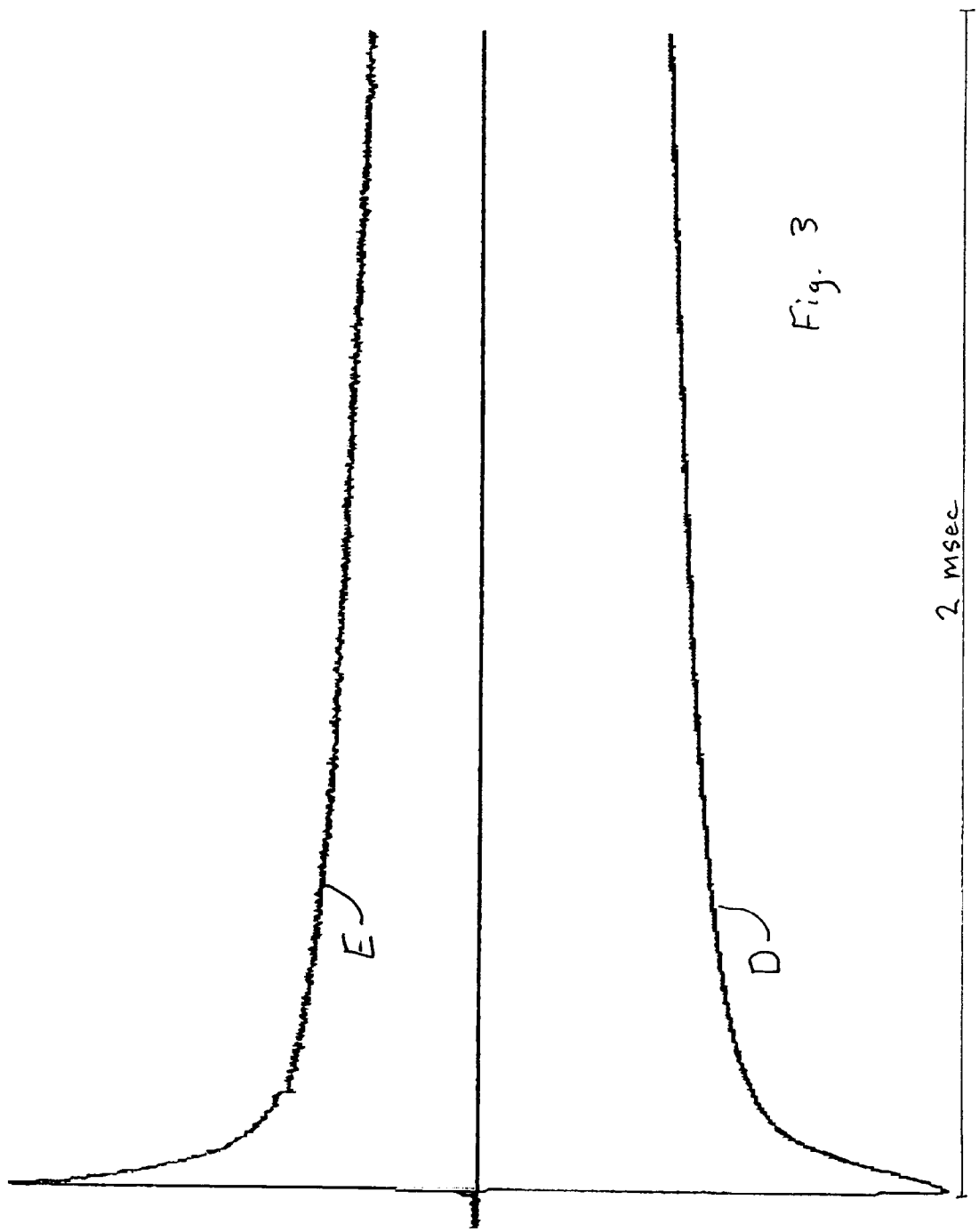

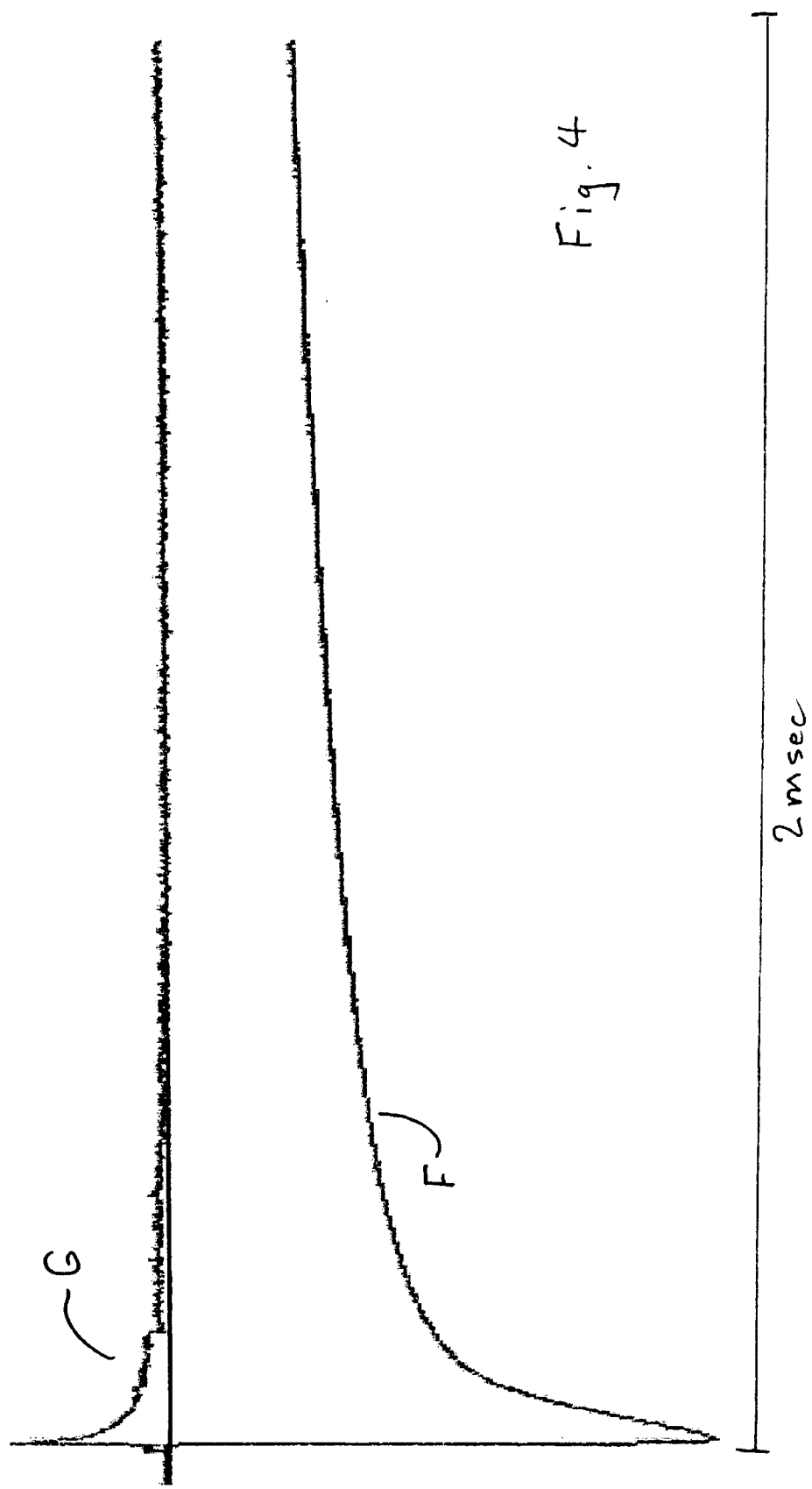

PRODUCT WAFER JUNCTION LEAKAGE MEASUREMENT USING LIGHT AND EDDY CURRENT

BACKGROUND OF THE INVENTION

The present invention relates to the measurement of the electrical characteristics of semiconductor product wafers and, in particular, the contactless measurement of junction leakage for different type junctions.

It is often desirable to make P-N junction leakage measurements on product wafers that contain many P-N junctions. A simple qualitative leakage measurement may be obtained by examining the median leakage behavior of all the P-N junctions on single chip. This may be done by exciting P-N junctions with light and examining the resultant photovoltaic decay of the junctions with a large capacitive sensor that is the approximate size of the product chip. Such a method works well when one particular type of P-N junction tends to dominate the general area of the chip. Examples would be a CMOS design, where the chip area was dominated by N wells or P wells, or for a bipolar design, where the chip area was dominated by subcollectors.

However, in many designs of interest, a particular type junction does not dominate, yet a leakage measurement for that type junction is desired. For example, in a CMOS design, it is also of interest to be able to examine leakage of the source-drain junctions that are located in the same N wells or P wells mentioned above. However, the photovoltaic signals from the much smaller source-drain junctions will tend to be much smaller (e.g., one tenth or less) of the photovoltaic signals from the N and/or P wells. A method for separating the photovoltaic signals from the differing types of junctions is needed.

SUMMARY OF THE INVENTION

A method for measuring junction leakage in a semiconductor product wafer having a first type junction and a second type junction includes applying varying light to the wafer, measuring a surface photovoltage characteristic for the wafer in response to the light, and measuring an eddy current characteristic for the wafer in response to the light. A junction leakage characteristic for at least one of junction types is determined from a combination of the surface photovoltage and the eddy current characteristics.

BRIEF DESCRIPTION OF THE DRAWINGS

FIG. 2 is a graph of measurements according to the invention on a bipolar product wafer.

FIG. 3 is a graph of measurements according to the invention on a DRAM product wafer.

FIG. 4 is a graph of measurements according to the invention on a heat damaged DRAM wafer.

DESCRIPTION OF THE PREFERRED EMBODIMENTS

Figure 1:
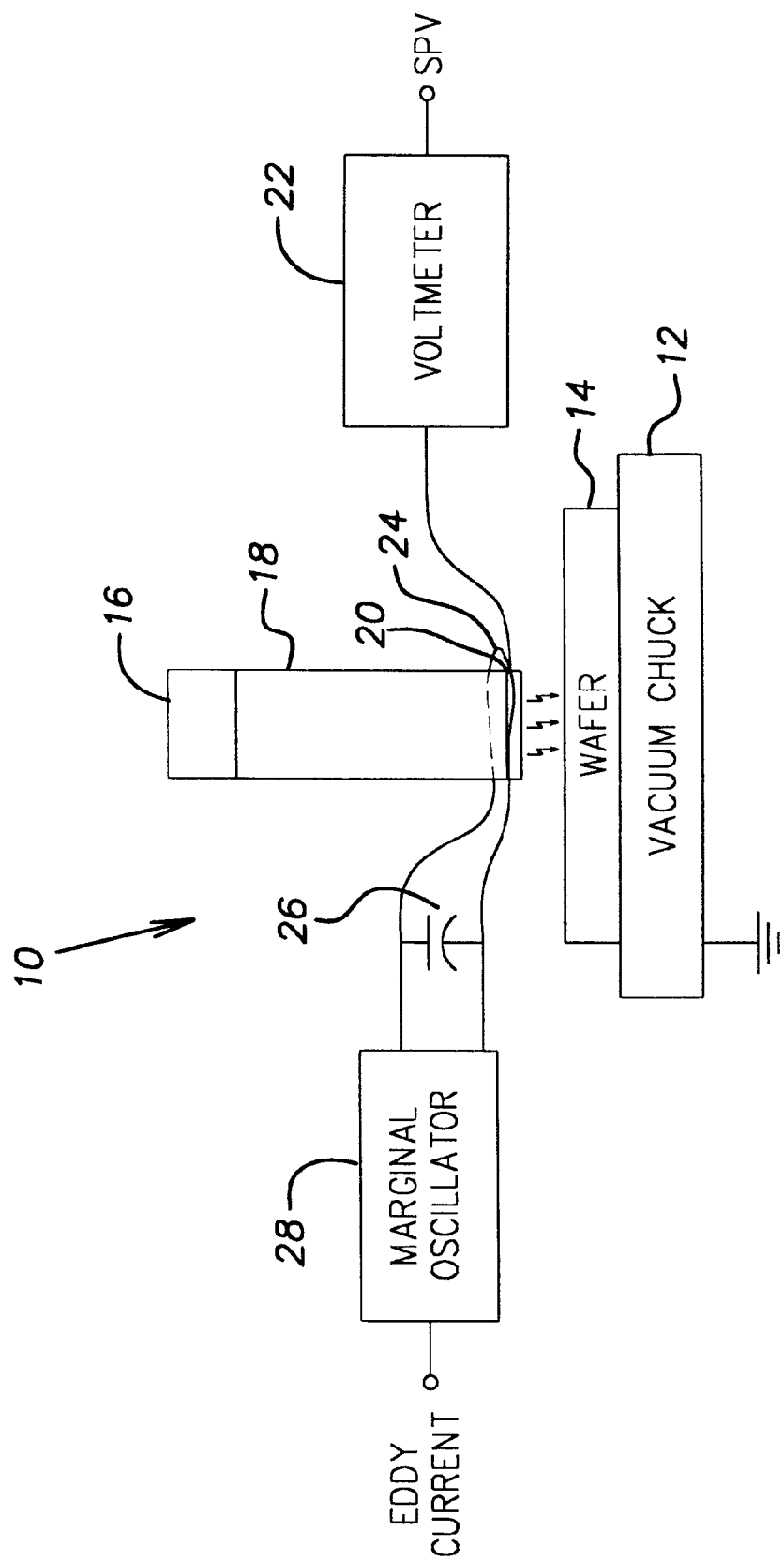
FIG. 1 is a combination block and schematic diagram of an apparatus for performing the method of the invention.

Referring to FIG. 1, an apparatus 10 is shown for measuring P-N junction leakage. A vacuum chuck 12 holds a semiconductor product wafer 14 to be tested. A light source 16 is optically coupled to a light pipe 18. The light source 16 may be, for example, a xenon flash tube. The light pipe 18 is coupled to an electrically conductive transparent window 20 (e.g., indium tin oxide).

The window 20 is electrically connected to a high impedance voltmeter 22. An eddy current sensor 24 surrounds the window 20. The sensor 24 may be, for example, a single turn electrical coil about, but electrically insulated from, the circumference of the window 20. The coil is in parallel with a capacitor 26, together forming a tank circuit tuned to, for example, about 150 megahertz.

The window 20 and the sensor 24 may have, for example, a diameter of ¼ inch. The distance between the window 20 and the wafer 14, may be, for example, 5 mils.

The sensor 24 is connected to an alternating current source/measurement unit 28. The unit 28 may be, for example, a marginal oscillator circuit, operating at, for example, a frequency of about 150 megahertz. A marginal oscillator circuit may be characterized as a constant A.C. current source operating at the resonant frequency of the tank circuit formed from the sensor 24 and the capacitor 26, which drives the tank circuit. The voltage across the tank corresponds to the quality factor, Q of the tank circuit, which in turn is directly related to the eddy currents induced by the sensor 24 in the wafer 14. Such a circuit is described in further detail in "A Contactless Method for High-Sensitivity Measurement of p-n Junction Leakage," *IBM J. RES. DEVELOP.*, Vol. 24, No. 3, May 1980, and is included herein by reference. Such circuits are commonly employed in MRI imaging applications.

The window 20 is used to obtain surface photovoltage (SPV) measurements and the sensor 24 is used to obtain measurements of eddy currents induced in the wafer by the electrical oscillations of the unit 28.

In the preferred embodiment, the eddy current characteristic and the SPV characteristic are measured simultaneously. This improves speed, reliability and repeatability.

Referring to FIG. 2, exemplary plots for a bipolar wafer are shown where the two dominant PN junctions are the N plus collector/P minus substrate junctions and the P base/N plus collector junctions (1 millisecond light pulse). Plot A illustrates the SPV characteristic and plot B illustrates the eddy current characteristic.

The physics of the measurement predict that the eddy current is due primarily to the collector/substrate junctions and the SPV is due to both the collector/substrate and collector/base junctions. This allows the plots A, B to be used to create the plot C, which represents the leakage characteristic for just the base/collector junctions. To form the plot C, the plot A is weighted by an empirically determined value (e.g., 1.25) and subtracted from the plot B. The weight value may be determined, for example, by adjusting the weight value to insure that the plot C does not start in the negative region, that the plot C does not end in the negative region, or by other reference measurements or statistics.

Multiple measurement cycles may be used to improve the accuracy of the measurement through such techniques as digital averaging.

Referring to FIG. 3, exemplary plots for a DRAM product wafer. Plot D illustrates the SPV characteristic and plot E illustrates the eddy current characteristic (3 microsecond light pulse).

The physics of the measurement predict that the eddy current is due primarily to the P source-drain/N well junctions and the SPV is primarily due to the N well/P minus Epi junctions.

Referring to FIG. 4, the same measurements are taken for a similar wafer where a high temperature heat cycle has damaged the source-drain/N well junctions (plot F—SPV, plot G—eddy current). As expected, the plots show that the source-drain/N well junctions have been damaged, but that the N well/P minus Epi junctions have not been damaged. The combination of the eddy current characteristics and the SPV characteristic allows the quick identification of the probable source of junction leakage (in this case an excessive heat cycle).

The area measured by the invention may be an entire wafer, or in the case of high density dies or chips (e.g., hundreds of junctions under the sensors) just the die or chip itself.

It should be evident that this disclosure is by way of example and that various changes may be made by adding, modifying or eliminating details without departing from the fair scope of the teaching contained in this disclosure. The invention is therefore not limited to particular details of this disclosure except to the extent that the following claims are necessarily so limited.

What is claimed:

1. A method for measuring junction leakage in a semiconductor product wafer having a first type junction and a second type junction, said method comprising:

applying varying light to said wafer;

measuring a surface photovoltage characteristic for said wafer in response to said light, said surface photovoltage characteristic being indicative of a junction leakage characteristic of a set of one or more of said type functions;

inducing eddy currents in said wafer;

measuring an eddy current characteristic for said wafer in response to said induced eddy currents and said light, said eddy current characteristic being indicative of a different set of one or more of said type junctions; and determining a junction leakage characteristic for at least one of said type junctions from said surface photovoltage and said eddy current characteristics.

2. A method according to claim 1, further comprising forming a weighted sum of said eddy current and said surface photovoltage characteristics in determining said junction leakage characteristic.

3. A method for measuring junction leakage in a semiconductor chip having a first type junction and a second type junction, said method comprising:

applying varying light to said wafer;

measuring a surface photovoltage characteristic for said chip in response to said light, said surface photovoltage characteristic being indicative of a junction leakage characteristic of a set of one or more of said type junctions;

inducing eddy currents in said chip;

measuring an eddy current characteristic for said chip in response to said induced eddy currents and said light, said eddy current characteristic being indicative of a different set of one or more of said type junctions; and determining a junction leakage characteristic for at least one of said type junctions from said surface photovoltage and said eddy current characteristics.

4. A method according to claim 3, further comprising forming a weighted sum of said eddy current and said surface photovoltage characteristics in determining said junction leakage characteristic.

* * * * *

UNITED STATES PATENT AND TRADEMARK OFFICE
CERTIFICATE OF CORRECTION

PATENT NO. : 6,072,320
DATED : June 6, 2000
INVENTOR(S) : Roger L. Verkuil

It is certified that error appears in the above-identified patent and that said Letters Patent is hereby corrected as shown below:

On the Title Page, under Other Publications, second reference, line 1 delete "fro" and insert therefore --for--.

Column 2, line 19 after "Q" insert --,--.

Claim 3, line 4 delete "wafer;" and insert therefore --chip;--.

Signed and Sealed this

Third Day of April, 2001

Attest:

NICHOLAS P. GODICI

Attesting Officer

Acting Director of the United States Patent and Trademark Office